(12) United States Patent
Feigenbaum et al.

(10) Patent No.: US 6,434,817 B1
(45) Date of Patent: Aug. 20, 2002

(54) METHOD FOR JOINING AN INTEGRATED CIRCUIT

(75) Inventors: Haim Feigenbaum, Irvine; Chris M. Schreiber, Lake Elsinore, both of CA (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/454,789

(22) Filed: Dec. 3, 1999

(51) Int. Cl.⁷ .................................................. H05K 3/34
(52) U.S. Cl. .............................. 29/840; 29/832; 29/847; 439/67; 439/68
(58) Field of Search ........................ 29/840, 832, 847; 439/67, 68

(56) References Cited

U.S. PATENT DOCUMENTS

| | | |
|---|---|---|
| 3,795,037 A | 3/1974 | Luttmer |
| 3,924,915 A | 12/1975 | Conrad |
| 4,029,375 A | 6/1977 | Gabrielian |
| 4,067,104 A | 1/1978 | Tracy |

(List continued on next page.)

FOREIGN PATENT DOCUMENTS

| | | |
|---|---|---|
| EP | 0540312 | 5/1993 |
| EP | 0889512 | 1/1999 |
| EP | 0967650 | 12/1999 |
| WO | 93/02831 | 2/1993 |

*Primary Examiner*—Carl J. Arbes
(74) *Attorney, Agent, or Firm*—Thomas N. Twomey

(57) ABSTRACT

A method for attaching an integrated circuit to a flexible circuit which includes the acts of providing an integrated circuit having a plurality of contact pads formed upon a surface thereof; providing a flexible circuit possessing a plurality of contact bumps formed integral to a surface area; and attaching the integrated circuit to the flexible circuit by fusing at least some of the contact bumps of the flexible circuit to at least some of the contact pads of the integrated circuit. The contact bumps have a shape which mitigates local stress buildup within the contact bumps after attachment of the contact bumps to the contact pads, so as to enhance the reliability of the electrical connection.

40 Claims, 4 Drawing Sheets

U.S. PATENT DOCUMENTS

| | | |
|---|---|---|
| 4,116,517 A | 9/1978 | Selvin et al. |
| 4,125,310 A | 11/1978 | Reardon, II et al. |
| 4,161,346 A | 7/1979 | Cherian et al. |
| 4,199,209 A | 4/1980 | Cherian et al. |
| 4,505,529 A | 3/1985 | Barkus |
| 4,511,197 A | 4/1985 | Grabbe et al. |
| 4,520,562 A | 6/1985 | Sado et al. .................... 29/878 |
| 4,553,192 A | 11/1985 | Babura et al. ............... 361/395 |
| 4,620,761 A | 11/1986 | Smith et al. |
| 4,655,519 A | 4/1987 | Evans et al. |
| 4,667,219 A | 5/1987 | Lee et al. |
| 4,751,199 A | 6/1988 | Phy |
| 4,891,014 A | 1/1990 | Simpson et al. |
| 4,893,172 A | 1/1990 | Matsumoto et al. |
| 4,902,606 A | 2/1990 | Patraw ........................ 430/314 |
| 4,927,369 A | 5/1990 | Grabbe et al. ................ 439/66 |
| 4,969,826 A | 11/1990 | Grabbe ........................ 439/66 |
| 5,015,191 A | 5/1991 | Grabbe et al. ................ 439/71 |
| 5,030,109 A | 7/1991 | Devy ........................... 439/66 |
| 5,061,192 A | 10/1991 | Chapin et al. ................ 439/66 |
| 5,071,787 A * | 12/1991 | Mori et al. |
| 5,086,337 A | 2/1992 | Noro et al. .................... 357/79 |
| 5,137,456 A | 8/1992 | Desai et al. ................... 439/66 |
| 5,139,427 A | 8/1992 | Boyd et al. ................... 439/66 |
| RE34,084 E | 9/1992 | Noschese ..................... 439/66 |
| 5,152,695 A | 10/1992 | Grabbe et al. ................ 439/71 |
| 5,167,512 A | 12/1992 | Walrup ......................... 439/66 |
| 5,173,055 A | 12/1992 | Grabbe ......................... 439/66 |
| 5,228,861 A | 7/1993 | Grabbe ......................... 439/66 |
| 5,297,967 A | 3/1994 | Baumberger et al. ......... 439/66 |
| 5,308,252 A | 5/1994 | Mroczkowski et al. ....... 439/66 |
| 5,341,979 A | 8/1994 | Gupta ......................... 228/111 |
| 5,364,277 A * | 11/1994 | Crumly et al. |
| 5,366,380 A | 11/1994 | Rexmond .................... 439/66 |
| 5,462,440 A | 10/1995 | Rothenberger ............... 439/66 |
| 5,466,161 A | 11/1995 | Yumibe et al. ............... 439/66 |
| 5,529,504 A | 6/1996 | Greenstein et al. ........... 439/91 |
| 5,608,966 A | 3/1997 | Donner et al. ................ 29/884 |
| 5,611,481 A | 3/1997 | Akamatsu et al. ..... 228/180.22 |
| 5,611,696 A | 3/1997 | Donner et al. ................ 439/66 |
| 5,657,207 A * | 8/1997 | Schreiber et al. |
| 5,686,318 A | 11/1997 | Farnworth et al. |
| 5,790,377 A | 8/1998 | Schreiber et al. ........... 361/704 |
| 5,795,818 A | 8/1998 | Marrs ......................... 438/612 |
| 5,801,441 A | 9/1998 | DiStefano |
| 5,866,441 A | 2/1999 | Pace ........................... 438/107 |
| 5,868,304 A | 2/1999 | Brofman et al. ............. 228/254 |
| 5,956,235 A * | 9/1999 | Kresge et al. |
| 5,963,793 A | 10/1999 | Rinne et al. ................. 438/107 |
| 5,966,593 A * | 10/1999 | Budnaitis et al. ............. 29/840 |
| 6,166,333 A * | 12/2000 | Crumly et al. |

* cited by examiner

METHOD FOR JOINING AN INTEGRATED CIRCUIT

TECHNICAL FIELD

The present invention relates generally to methods for forming electrical interconnections. The present invention relates more particularly to a method for joining an integrated circuit or the like to a flexible circuit, wherein contact bumps that facilitate electrical interconnection have a profile or cross-sectional configuration which mitigates stresses therein while facilitating penetration of an oxide layer formed upon mating contact pads and wherein heat is applied so as to simultaneously cure a pre-applied epoxy underfill and fuse the contact bumps to the contact pads.

BACKGROUND OF THE INVENTION

Methods for attaching integrated circuits and the like to printed wiring boards (PWBs) are well-known. Such methods enable the fabrication of various electronic subassemblies, such as motherboards and daughterboards for personal computers.

Contemporary methods for attaching integrated circuits to printed wiring boards include the use of various integrated circuit packaging technologies such as those associated with dual in-line package (DIP), plastic lead chip carrier (PLCC), ceramic pin grid array (CPGA), plastic quad flat pack (PQFP), quad flat pack (QFP), tape carrier package (TCP), ball grid array (BGA), thin small outline package gull-wing (TSOP), small outline package J-lead (SOJ), shrink small outline package gull-wing (SSOP) and plastic small outline package (PSOP).

According to DIP packaging technology, the two parallel rows of leads extending from the integrated circuit package pass through holes formed in the printed wiring board and are soldered into the holes. Optionally, a socket may be utilized.

Integrated circuits packaged according to PLCC and CPGA technologies typically require the use of a socket.

PQFP, QFP, TCP, BGA, TSOP, SOJ, SSOP and PSOP are examples of surface mount technology, wherein the packaged integrated circuit is attached directly to a printed wiring board, typically by such techniques as re-flow soldering and/or thermal compression.

For example, BGAs comprise a plurality of contact pads formed so as to define a 2-dimensional array upon the bottom surface of an integrated circuit package. Each electrical contact comprises a small ball of solder which facilitates interconnection to a complimentary array of flat electrical contact pads formed upon a printed wiring board. The small solder balls melt during reflow soldering to effect connection to a corresponding array of connectors formed upon the printed wiring board.

As the number of transistors formed upon a single integrated circuit increases, the ability to attach that integrated circuit to a printed wiring board or the like becomes more difficult. It is expected that the number of transistors formed upon a single integrated circuit will increase from its present number of approximately 80 million to approximately 100 million by the year 2000.

BGAs support high pin counts, so as to facilitate the use of integrated circuits having a larger number of devices formed thereon. By taking advantage of the comparatively large surface area on the bottom of an integrated circuit package, ball grid arrays provide for a comparatively large number of electrical interconnections between the integrated circuit and a printed wiring board.

Flexible circuitry for the communication of electrical signals between electrical components is well-known. Such flexible circuitry generally comprises a flexible dielectric substrate and a plurality of flexible conductive conduits formed thereon. For example, flexible circuitry may define wiring harnesses, transmission lines or part connectors. Flexible circuitry is frequently utilized to facilitate electrical interconnection between printed wiring boards or electronic assemblies.

It is frequently desirable to attach integrated circuits and the like to flexible circuits. Such direct connection of an integrated circuit to a flexible circuit eliminates the need for an intermediate printed wiring board, and thus results in a substantial cost savings. Thus, integrated circuits may be attached to flexible circuits so as to define electronic subassemblies which may either include or not include rigid printed wiring boards.

Generally, many of the same methods used to attach integrated circuits to rigid printed wiring boards may also be utilized to attach integrated circuits to flexible circuitry. Thus, sockets and/or contemporary surface mount techniques may generally be utilized to attach integrated circuits to flexible circuits.

Although such contemporary methods for attaching integrated circuits and the like to flexible circuitry have proven generally satisfactory, such contemporary methods do possess inherent deficiencies. For example, it is desirable to attach integrated circuits, whether packaged or not, to substrates such as flexible circuitry utilizing contact bumps which provide a stand-off distance between the integrated circuit and the flexible circuitry. This stand-off distance facilitates the accommodation of some degree of mismatch in thermal coefficient of expansion between the integrated circuit and the flexible circuit. That is, when either the integrated circuit or the flexible circuit contracts or expands more than the other, then the contact bumps accommodate some of the difference in such contraction or expansion by bending slightly.

However, such bending of the contact bumps may induce localized stresses which cause stress fractures. As those skilled in the art will appreciate, such stress fractures result in reduced conductivity through the contact bump, and may even result in complete discontinuity. Although it is possible to define contact bumps which are less likely to fracture due to localized stress buildup, such construction is contrary to achieving another desired objective of such contact bumps, which is to penetrate an oxide layer formed upon the contact pads to which the contact bumps mate.

As those skilled in the art will appreciate, an oxide layer frequently tends to form upon metallic contact pads. For example, the aluminum pads frequently used to define contact pads of integrated circuits, printed circuit boards and other electrical components tend to have a layer of aluminum oxide formed thereupon due to exposure to oxygen in the atmosphere. Such oxide layer tends to inhibit the formation of an adequate electrical contact with the electrical contact therebeneath. Thus, it is necessary to remove at least a portion of the oxide layer in order to facilitate desired electrical conduction with the electrical contact.

According to contemporary practice, contact bumps formed upon an integrated circuit mate with corresponding contact pads formed upon the flexible circuitry. In accomplishing such mating, the contact bumps must scratch, scrape, or otherwise penetrate an oxidation layer formed upon the contact pads. Failure of the contact bumps to penetrate such oxide layer results in an undesirably high resistance at the interface of the contact bump and the contact pad. This undesirable high resistance may result in failure of the device.

It is also desirable to enhance the mechanical attachment of an integrated circuit to flexible circuitry by utilizing an epoxy underfill. The epoxy underfill is typically wicked into place between the integrated circuit and the flexible circuit after attachment of the integrated circuit to the flexible circuit. However, according to contemporary practice, the use of such an epoxy underfill necessitates a separate heating in order to effect the curing thereof.

According to contemporary practice, one heating of the device is necessary in order to effect fusion of the contact bumps with the contact pads, so as to effect a desired electrical connection. Another heating of the device is necessary so as to effect curing of an epoxy underfill.

However, the polymers used in the fabrication of the flexible circuitry, as well as the integrated circuit itself, may be susceptible to undesirable degradation due to the excessive heating associated with two such separate heating processes. Further, as those skilled in the art will appreciate, the use of two such separate heating processes undesirably increases the costs associated with the fabrication of such devices.

In view of the foregoing, it is desirable to provide a method for attaching an integrated circuit or the like to flexible circuitry wherein the method mitigates localized stress buildup within the contact bumps utilized for such electrical interconnection, while maintaining a desired ability of the contact bumps to penetrate an oxide layer of corresponding contact pads, so as to assure adequate electrical contact therewith.

It is also desirable to provide a method which facilitates the use of an epoxy underfill while eliminating the need for an undesirable second heating procedure.

SUMMARY OF THE INVENTION

The present invention specifically addresses and alleviates the above-mentioned deficiencies associated with the prior art. More particularly, one aspect of the present invention comprises a method for attaching an integrated circuit to a flexible circuit by providing an integrated circuit having a plurality of contact pads formed upon a surface thereof and providing a flexible circuit having a plurality of corresponding contact bumps formed upon or integral to a surface thereof. The integrated circuit is attached to the flexible circuit by fusing at least some of the contact bumps of the flexible circuit to at least some of the corresponding contact pads of the integrated circuit.

The contact bumps have a shape which mitigates local stress buildup therein after attachment of the contact bumps to the contact pads. The shape of the contact bumps is such that penetration of an oxide layer of the contact pads is facilitated during such attachment of the integrated circuit to the flexible circuit.

Further, one aspect of the present invention comprises a method for applying heat so as to simultaneously fuse the contact bumps of one electrical device such as a flexible circuit to the contact pads of another electrical device such as an integrated circuit while simultaneously curing an epoxy underfill.

These, as well as other advantages of the present invention, will be more apparent from the following description and drawings. It is understood that changes in the specific structure shown and described may be made within the scope of the claims without departing from the spirit of the invention.

DESCRIPTION OF THE PREFERRED EMBODIMENT

Figure 1:
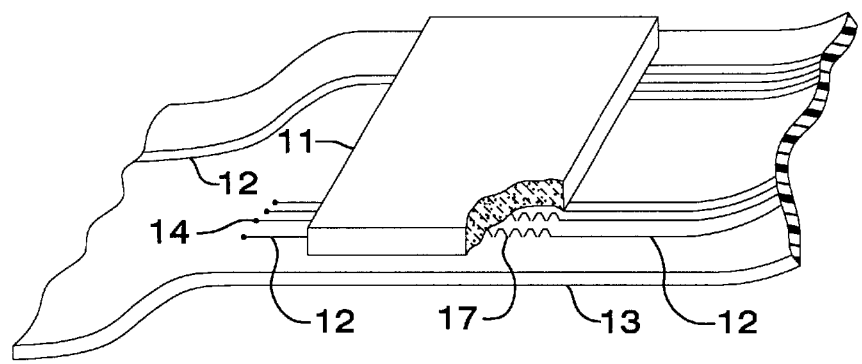
FIG. 1 is a perspective view of an integrated circuit attached to a flexible circuit according to the present invention and having a portion of the integrated circuit broken away to show contact bumps of the flexible circuit thereberneath.

The detailed description set forth below in connection with the appended drawings is intended as a description of the presently preferred embodiments of the invention and is not intended to represent the only forms in which the present invention may be constructed or utilized. The description sets for the functions and the sequence for constructing and operating the invention in connection with the illustrated embodiments. It is to be understood, however, that the same or equivalent functions and sequences may be accomplished by different embodiments that are also intended to be encompassed within the spirit and scope of the invention.

The present invention comprises a method for attaching an integrated circuit to a flexible circuit wherein an integrated circuit having a plurality of contact pads formed upon a surface thereof is mated to a flexible circuit having a corresponding plurality of contact bumps formed upon a surface thereof. The contact bumps may optionally be formed integrally to the flexible circuit.

The integrated circuit is attached to the flexible circuit by fusing at least some of the contact bumps of the flexible circuit to at least some of the contact pads of the integrated circuit.

According to one aspect of the present invention, the contact bumps have a shape which mitigates local stress buildup within the contact bumps after attachment of the contact bumps to the contact pads of the integrated circuit.

As those skilled in the art will appreciate, such stress buildup is likely to occur when the integrated circuit and the flexible circuit have different coefficients of expansion, such that temperature changes result in relative movement of the integrated circuit with respect to the flexible circuit.

By mitigating stress buildup within the contact bumps, the likelihood of the formation of undesirable stress fractures in the contact bumps is mitigated, thereby substantially enhancing the reliability of the connection of the integrated circuit to the flexible circuit.

Those skilled in the art will appreciate that various different electronic devices or components are attached to a substrate in a manner similar to the manner in which integrated circuits are attached to a substrate. That is, various electronic devices or components utilize contact pads similar to those of integrated circuits. For example, multi-chip modules and various packaged electronic components may be attached to a printed circuit board or to flexible circuitry in a manner similar to the way in which an integrated circuit is attached thereto.

As used herein, the term "integrated circuit" is defined to include all such electronic devices which attach to a substrate, e.g., flexible circuitry, in a manner similar to the manner in which integrated circuits attach to a substrate. Thus, the term "integrated circuit" as used herein is defined to include multi-chip modules, hybrids, bare integrated circuits (die), packaged integrated circuits and any other electronic devices which utilize electrical contacts similar to those of integrated circuits.

According to one aspect of the present invention, the contact pads of the integrated circuit comprise generally planar aluminum contact pads. Alternatively, the contact pads of the integrated circuit may similarly comprise contact bumps or balls. Indeed, it is contemplated that the present invention may be utilized to effect the attachment of an integrated circuit to flexible circuitry, wherein the integrated circuit comprises various different types of surface mount technology contact configurations. Indeed, the contact bumps may alternatively be formed upon the integrated circuit or other device and the contact pads may alternatively be formed upon the flexible circuit.

According to one aspect of the present invention, the contact bumps of the flexible circuit are configured so as to facilitate the distribution of stress generally throughout each contact bump after attachment of the contact bumps to the contact pads of the integrated circuit or the like. The contact bumps of the flexible circuit have a shape which facilitates such distribution of stress generally equally there throughout.

Further, the contact bumps of the flexible circuit have a shape which enhances penetration of an oxidation layer of the contact pads of an integrated circuit or the like by the contact bumps.

Thus, the contact bumps of the present invention are formed so as to mitigate the occurrence of undesirable stress fractures, due to localized stress formation therein, and the contact bumps are also configured so as to have a shape which facilitates penetration of the oxide layer which frequently forms upon the aluminum contact pads of integrated circuits and the like, so as to assure adequate electrical conduction between the integrated circuit and the flexible circuitry.

As those skilled in the art will appreciate, formation of contact bumps to both mitigate the occurrence of undesirable stress fractures and penetrate an oxide layer represents conflicting objectives. Localized stress formation may be mitigated by making the bumps such that they have a lower aspect ratio, i.e., are shorter and wider. Making the contact bumps such that they more easily penetrate an oxide layer requires that the contact bumps be thinner and more pointed. Thus, the formation of contact bumps which both mitigate local stress buildup and penetrate an oxide layer requires a trade-off or balance between the height and width parameters of the contact bumps.

As discussed in further detail below, the contact bumps of the flexible circuit have a height of between approximately 0.001 inch and approximately 0.008 inch, typically 0.006 inch; the base of each contact bump preferably has a width of between approximately 0.001 inch and approximately 0.010 inch, typically approximately 0.008 inch; the contact bumps have a slope angle of between approximately 40 degrees and approximately 80 degrees, typically approximately 75 degrees; and the contact bumps have a tip radius of between approximately 0.001 inch and approximately 0.030 inch, typically approximately 0.020 inch.

The contact bumps of the flexible circuit are typically formed such that the number of contact bumps generally corresponds to the number of contact pads of the integrated circuit and such that the contact bumps of the flexible circuit are configured in a generally complimentary fashion with respect to the contact pads of the integrated circuit.

The contact pads of the integrated circuit may be formed of a non-lead containing material, so as to mitigate undesirable usage of lead. The contact bumps may be comprised of gold, such as substantially pure gold, so as to facilitate the formation of a highly conductive connection, while mitigating the need for lead. According to one aspect of the present invention, the contact bumps of the flexible circuit comprise a layer of substantially pure gold, formed upon a layer of copper.

Thermocompression or thermosonic energy may be utilized to effect fusion of the contact bumps of the flexible circuit to the contact pads of the integrated circuit. In either instance, heat is typically applied.

Optionally, an epoxy underfill is applied intermediate the flexible circuit and the integrated circuit prior to attaching the integrated circuit to the flexible circuit. The epoxy underfill may be applied either to the integrated circuit, the flexible circuit, or to both the integrated circuit and the flexible circuit, as desired.

According to one aspect of the present invention, heat is applied so as to facilitate generally simultaneous curing of the epoxy underfill and fusion of the contact bumps of the flexible circuit with the contact pads of the integrated circuit.

Optionally, an encapsulant may be applied to the integrated circuit such that the encapsulant substantially covers the integrated circuit and also covers a portion of the flexible circuit proximate the integrated circuit. One example of such an encapsulant is Hysol FP4544, such as that sold by Dexter Hysol Aerospace, Inc. of Pittsburgh, Calif. As those skilled in the art will appreciate, such encapsulants provide physical and chemical protection to the connection between the integrated circuit and the flexible circuit.

Referring now to FIG. 1, the present invention comprises a method for attaching an integrated circuit 11 to a flexible circuit 13. The integrated circuit 11 has an array of contact pads 15 (FIG. 2) formed upon the bottom surface thereof and the flexible circuit 13 has a corresponding array of contact bumps 17 formed upon the upper surface thereof. As those skilled in the art will appreciate, flexible circuits 13 are commonly used in various applications such as in the interconnection of printed wiring boards or in electronic assemblies, wiring harnesses, multi-line conductors, etc. By facilitating the attachment of integrated circuits to flexible circuits, the flexible circuit may be configured so as to comprise active circuitry such as amplifiers, logic, and multiplexers, as well as displays such as LEDs and LCD read-outs, etc.

By forming the contact bumps 17 upon the flexible circuit 13 rather than upon the integrated circuit 11, the need to form bumps, apply solder balls or otherwise modify the flat pad electrical contacts of the integrated circuit 11 is eliminated. As those skilled in the art will appreciate, the formation of contact bumps 17 upon the flexible circuit 13 is a simpler and less expensive process, since the flexible circuit 13 does not contain active circuitry, e.g., transistors, and is therefore less delicate and easier to handle. As such, formation of the contact bumps 17 upon the flexible circuit 13 rather than upon the integrated circuit 11 provides a substantial cost benefit.

For example, an integrated circuit may be attached to a flexible circuit to facilitate the multiplexing of electrical signals between automobile engine sensors and dashboard indicators, so as to substantially reduce the complexity and cost of the flexible circuit required. Indeed, the dashboard indicators themselves may comprise LCD displays which are attached to the flexible circuit according to the methodology of the present invention.

Conductive conduits or traces 12 extend from contact bumps 17, so as to provide desired electrical interconnection of the integrated circuit 11 with other electrical components. Optionally, vias 14 provide electrical connection of the traces 12 with similar traces formed upon the opposite surface of the flexible circuit 13 or formed upon intermediate layers of the flexible circuit 13. Some of the contact bumps optionally have vias formed directly therebeneath to facilitate electrical contact with desired electrical components.

Figure 2:
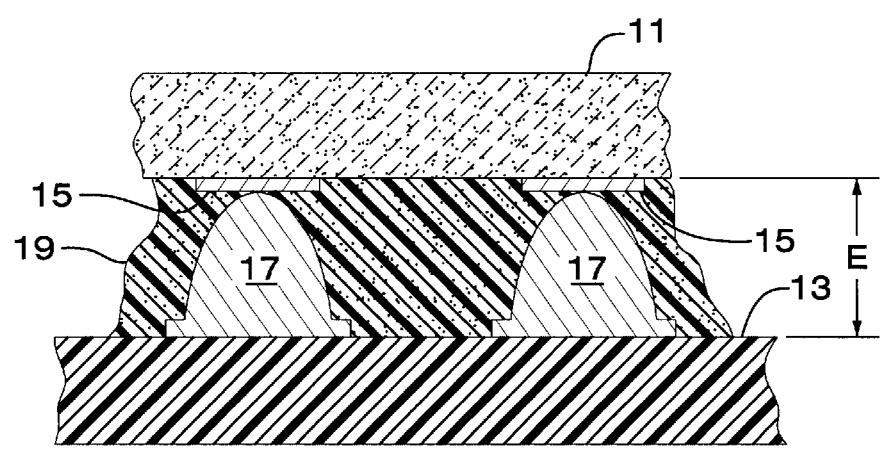
FIG. 2 is a cross-sectional side view of a portion of the integrated circuit and flexible circuit of FIG. 1 showing the contact bumps of the flexible circuit contacting the contact pads of the integrated circuit.

Referring now to FIG. 2, the integrated circuit 11 is attached to the flexible circuit 13 by fusing contact bumps 17 of the flexible circuit 13 to electrical contacts, such as contact pads 15, of the integrated circuit 11. The contact pads 15 are typically formed of aluminum. The contact bumps 17 preferably comprise substantially pure gold which is capable of fusing to the aluminum contact pads 15 of the integrated circuit when heated and compressed or subjected to some other form of energy, e.g., acoustic energy. Thus, thermocompression and/or thermosonic energy may be utilized to effect fusion of the contact bumps 17 of the flexible circuit 13 with the contact pads 15 of the integrated circuit 11.

According to one aspect of the present invention, each contact bump 17 is generally symmetric about its vertical axis and is formed to have a cross-sectional configuration or profile which mitigates localized stress buildup while facilitating penetration of the aluminum oxide layer which inherently forms upon the surface of contact pads 15, as discussed in detail below.

The stand-off distance, Dimension E, provided by the contact bumps helps distribute stress due to coefficient of thermal expansion mismatch between the flexible circuit and the integrated circuit.

Optionally, an epoxy underfill 19 is provided intermediate the integrated circuit 11 and the flexible circuit 13. As those skilled in the art will appreciate, such an epoxy underfill provides a physical barrier so as to inhibit undesirable contamination of the contact bumps 17 and contact pads 15. The epoxy underfill 19 thus inhibits undesirable oxidation of the contact bumps 17 and the contact pads 15. An encapsulant (22 of FIG. 4) may optionally be utilized to further inhibit undesirable contamination of the contact bumps 17 and the contact pads 15. The epoxy underfill 19 also firmly attaches the integrated circuit 11 to the flexible circuit 13 and tends to distribute and mitigate stresses which occur due to a mismatch in thermal coefficient of expansion (TCE) between the integrated circuit 11 and the flexible circuit 13.

Thus, the epoxy underfill 19 and the bump profile cooperate to substantially mitigate the occurrence of undesirable stress fractures in the contact bumps 17, and thereby substantially enhance the reliability of the electrical connection of the integrated circuit 11 to the flexible circuit 13.

Figure 3:
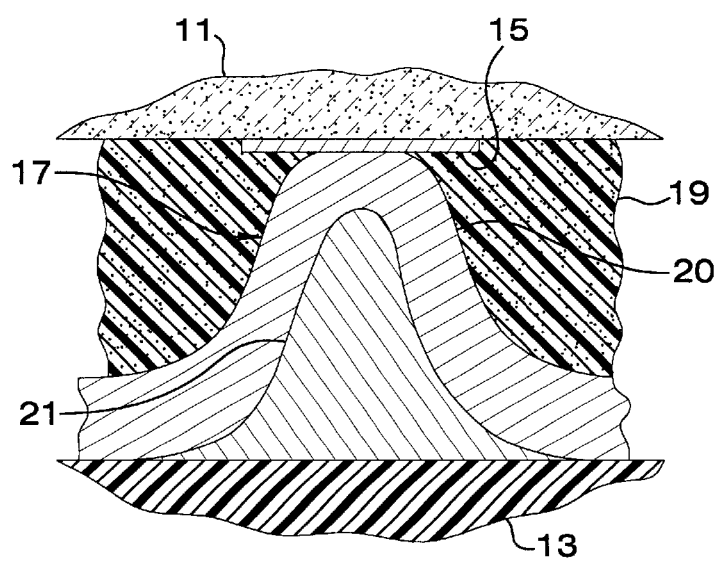
FIG. 3 is an enlarged cross-sectional view of an alternate construction of a single contact bump of FIG. 1, showing a layer of substantially pure gold formed upon a copper protuberance of the flexible circuit.

Referring now to FIG. 3, in one aspect of the present invention substantially pure gold 20 is formed as a layer which substantially covers a bump or protuberance 21. The protuberance 21 is preferably formed of copper.

The contact bumps 17 may be formed by plating-up metal or be depositing metal so as to define a bump. Alternatively, a mandrel process, such as that disclosed in U.S. Pat. No. 5,207,887 issued on May 4, 1993 to Crumley et al. or U.S. Pat. No. 5,364,277 issued on Nov. 15, 1994 to Crumley et al., both of which are hereby expressly incorporated by reference, may be utilized so as to form the contact bumps 17. Those skilled in the art will appreciate that various other methods for forming the contact bumps 17 may likewise be suitable.

Figure 4:
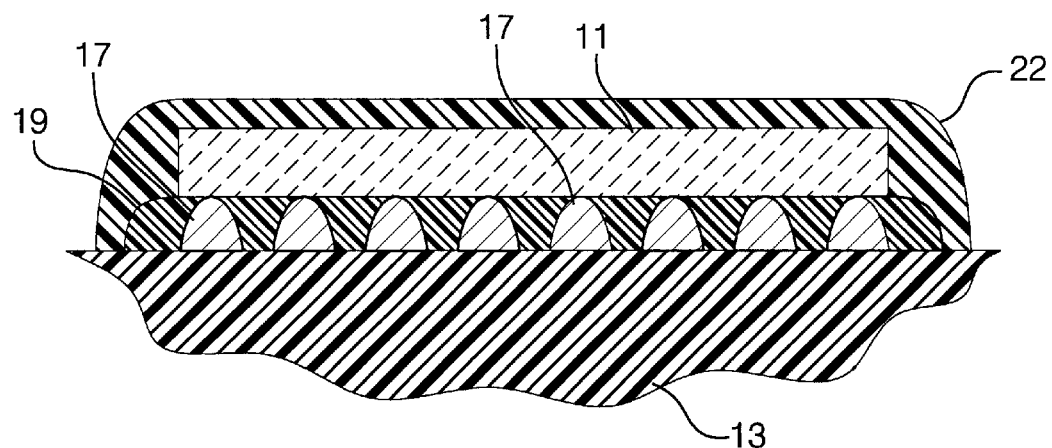
FIG. 4 is a cross-sectional side view of an integrated circuit attached to a flexible circuit according to the present invention and having an epoxy pre-fill disposed intermediate the integrated circuit and the flexible circuit and also having an encapsulant formed over the integrated circuit.

Referring now to FIG. 4, an encapsulant 22 may be formed so as to substantially cover the integrated circuit 11 and a portion of the flexible circuit 13 which is proximate the integrated circuit 11. One example of such an encapsulant is Hysol FP4544 manufactured by Dexter Hysol Aerospace, Inc. of Pittsburgh, Calif. The encapsulant provides additional protection from external contaminants which may tend to corrode or otherwise degrade the electrical connection provided by the contact bumps 17 of the flexible circuit 13 and the contact pads 15 of the integrated circuit 11. The encapsulant 22 also provides a degree of mechanical protection and tends to hold the integrated circuit in place upon the flexible circuit 13. According to different aspects of the present invention, any combination of the epoxy underfill 19 and the encapsulant 22 may be utilized, as desired.

Figure 5:
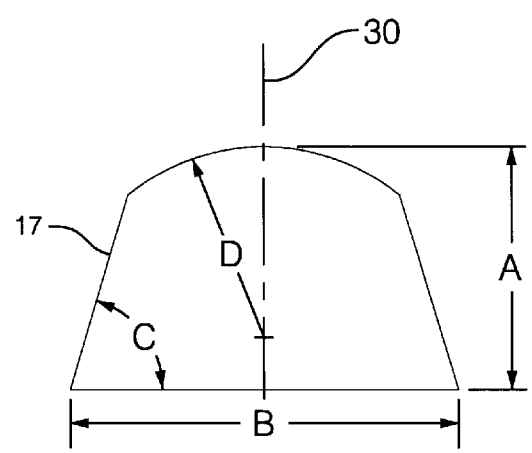
FIG. 5 is an enlarged profile of a single contact bump formed according to the present invention and indicating the important dimensions thereof.

Referring now to FIG. 5, the detailed configuration or profile of the contact bumps 17 is shown. Each bump 17 is generally radially symmetric about the vertical axis 30 thereof. The profile of the contact bumps 17 is defined in a manner which mitigates localized stress buildup therein while maintaining an ability to penetrate an oxide layer of the electrical contact or contact pad 15 of the integrated circuit 11.

As those skilled in the art will appreciate, localized stress buildup is mitigated by providing a contact bump profile which tends to be shorter, wider, and less pointy. However, oxidation layer penetration tends to be better facilitated by contact bumps which are narrower and more pointed. Thus, stress mitigation and oxidation layer penetration are conflicting objectives since enhancing one of these objectives generally tends to degrade the other objective.

According to the present invention, a balance between the parameters of height (Dimension A), base width (Dimension B), slope (Angle C), and tip radius (Dimension D) provides a desired degree of localized stress buildup mitigation while also maintaining an ability of the contact bumps 17 to penetrate the oxidation layer of a contact pad 15.

According to the present invention, the height (Dimension A) is between approximately 0.001 inch and approximately 0.008 inch, preferably approximately 0.006 inch; the base width (Dimension B) is between approximately 0.001 inch and approximately 0.010 inch, preferably approximately 0.008 inch; the slope angle (Dimension C) is between approximately 40 degrees and approximately 80 degrees, preferably approximately 75 degrees; and the tip radius (Dimension D) is between approximately 0.001 inch and approximately 0.030 inch, preferably approximately 0.020 inch.

Figure 6:
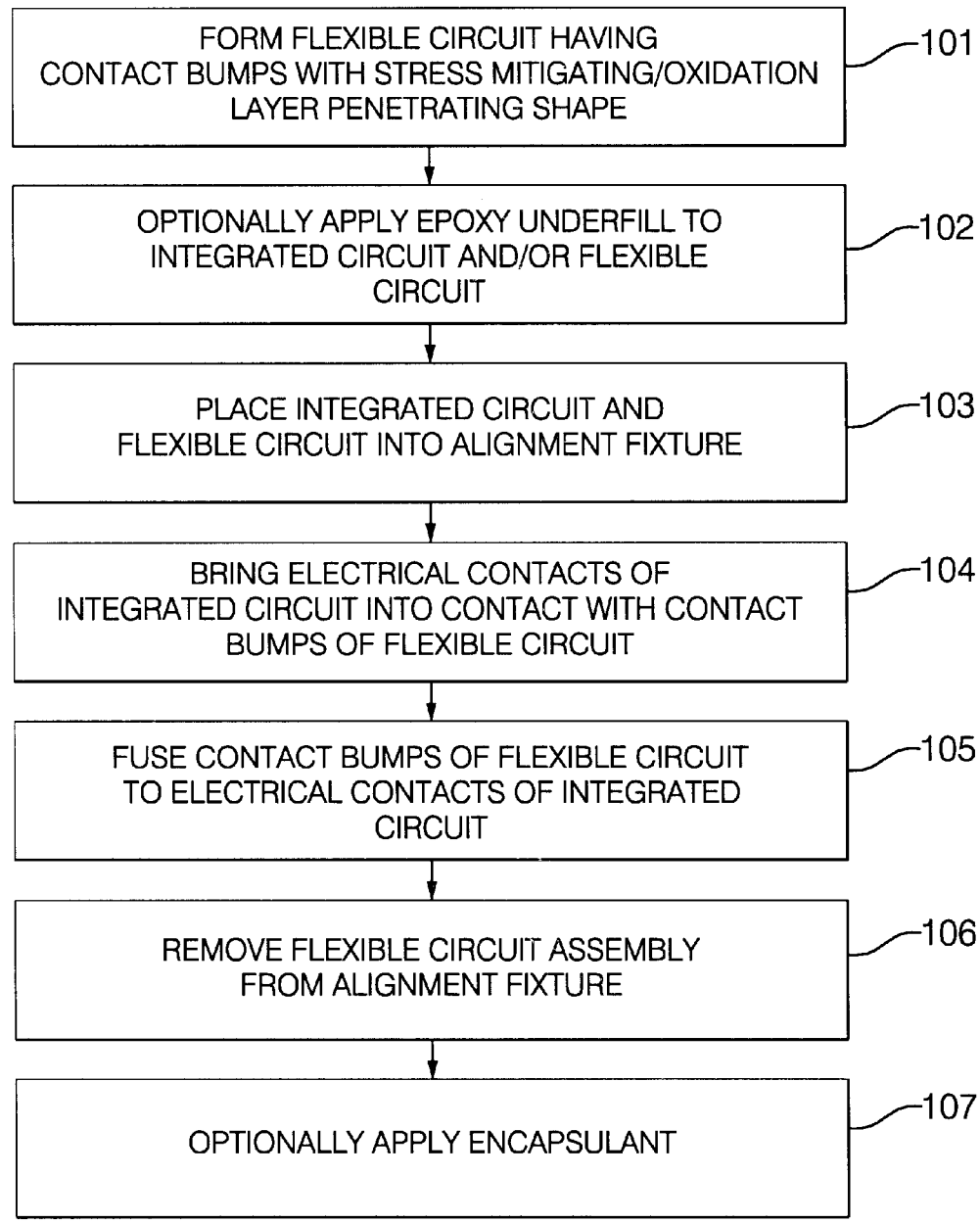
FIG. 6 is a flowchart showing the method for attaching an integrated circuit to a flexible circuit according to one aspect of the present invention, wherein the contact bumps are formed so as to mitigate localized stress buildup therein while maintaining a desired ability of the contact bumps to penetrate an oxidation layer of the contact pads of the integrated circuit to which the contact bumps mate.

Referring now to FIG. 6, the method for attaching an integrated circuit to a flexible circuit according to one aspect of the present invention is depicted. As shown in block 101, a flexible circuit having contact bumps with a stress mitigating/oxidation layer penetrating shape is formed so as to facilitate the reliable attachment of the integrated circuit 11 (FIGS. 1–4) to the flexible circuit 13.

As shown in block 102, epoxy underfill is optionally applied to the integrated circuit 11 and/or the flexible circuit 13 to further enhance the durability and reliability of the connection of the integrated circuit 11 to the flexible circuit 13, as discussed in detail above. Such pre-application of the epoxy underfill eliminates the need to later wick the epoxy underfill between the integrated circuit 11 and the flexible circuit 13.

As shown in block 103, the integrated circuit 11 and the flexible circuit 13 are placed into an alignment fixture which facilitates attachment of the contact bumps 17 of the flexible circuit 13 to the contact pads 15 of the integrated circuit 11 according to a desired alignment thereof. Generally, the integrated circuit 11 will be aligned with respect to the flexible circuit 13 such that each contact bump 17 of the flexible circuit 13 contacts each contact pad 15 of the integrated circuit 11 proximate the center of each contact pad 15.

As shown in block 104, the electrical contacts or contact pads 15 of the integrated circuit 11 are brought into contact with the contact bumps 17 of the flexible circuit 13.

As shown in block 105, the contact bumps 17 of the flexible circuit 13 are fused to the contact pads 15 of the integrated circuit 11, which may, if desired, be performed utilizing thermocompression and/or thermosonic energy, as discussed in detail below.

As shown in block 106, after fusing the contact bumps 17 of the flexible circuit 13 to the contact pads 15 of the integrated circuit 11, then the flexible circuit assembly which results from such fusion is removed from the alignment fixture to provide the desired electronic subassembly.

As shown in block 107, an encapsulant is optionally applied over a substantial portion of the integrated circuit 11, as discussed above.

Figure 7:
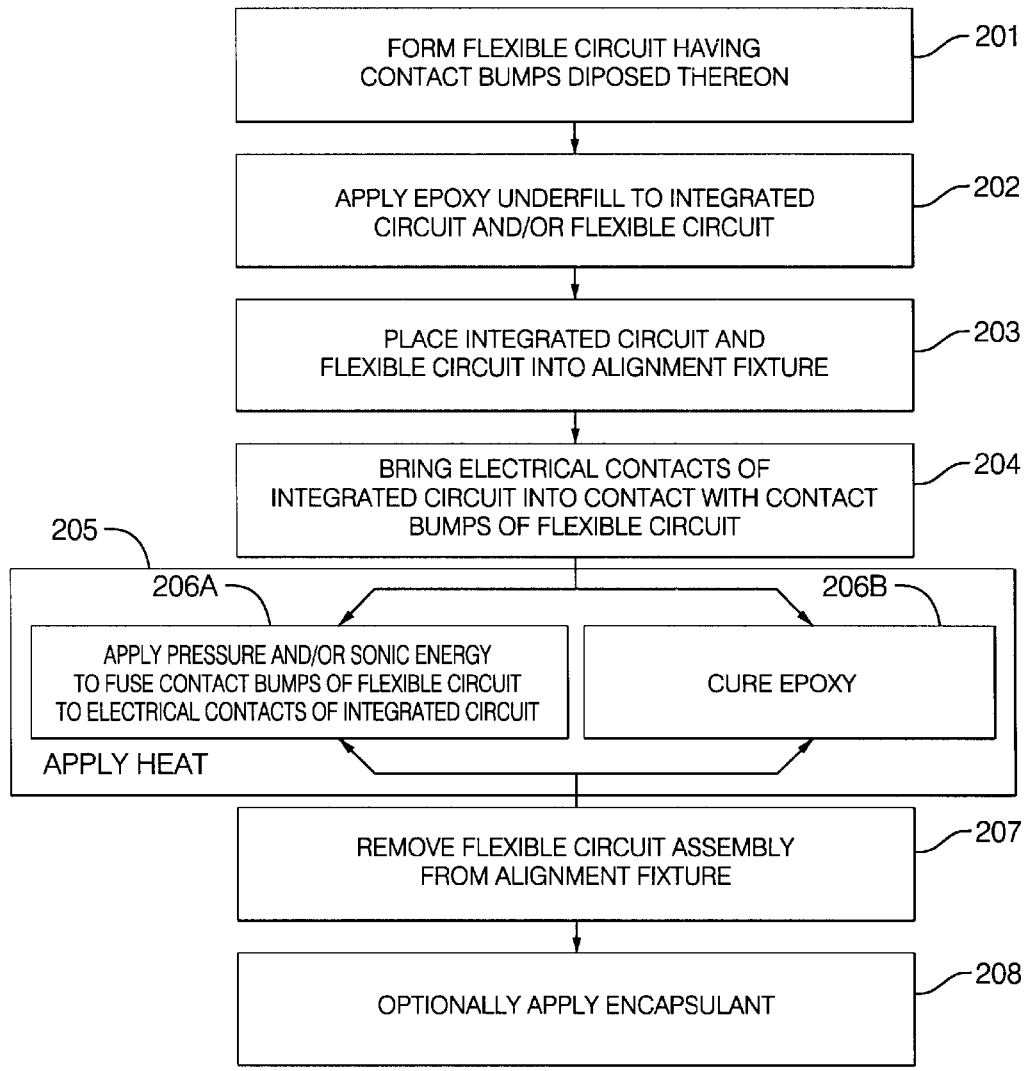
FIG. 7 is a flowchart showing the method for attaching an integrated circuit to a flexible circuit according to another aspect of the present invention, wherein heat applied to the integrated circuit and flexible circuit facilitates simultaneous fusion of the contact bumps of the flexible circuit to the contact pads of the integrated circuit and curing of the epoxy underfill.

Referring now to FIG. 7, according to another aspect of the present invention, an epoxy underfill is cured simultaneously with fusing of the contact bumps 17 to the contact pads 15.

As shown in block 201, a flexible circuit 13 having contact bumps disposed thereon may alternatively be formed having contact bumps which are not formed according to the stress mitigating/oxidation layer penetrating shape discussed above. However, the contact bumps may be formed according to the stress mitigating/oxidation layer penetrating shape discussed in detail above, if desired.

As shown in block 202, epoxy underfill is applied to the integrated circuit 11 and/or the flexible substrate 13. Again, such pre-application avoids the need for later wicking of the epoxy underfill.

As shown in block 203, the integrated circuit and the flexible circuit are placed into the alignment fixture so as to assure proper alignment of the integrated circuit 11 with respect to the flexible circuit 13.

As shown in block 204, the electrical contacts or contact pads 15 of the integrated circuit 11 are brought into contact with the contact bumps 17 of the flexible circuit 13 so as to facilitate desired attachment of the integrated circuit 11 to the flexible substrate 13.

As shown in block 205, after the contact pads 15 of the integrated circuit 11 are brought into contact with the contact bumps 17 of flexible circuit 13, then heat is applied to the integrated circuit 11 and/or the flexible circuit 13. More particularly, the contact bumps 17 of the flexible circuit 13 and the contact pads 15 of the integrated circuit 11 are heated so as to facilitate fusion of the contact bumps 17 to the corresponding contact pads 15. Pressure and/or sonic energy may be utilized to facilitate such fusion, as shown in block 206A. This application of heat facilitates simultaneous curing of the epoxy underfill 19 as shown in block 206A.

In this manner, both fusion of the contact bumps 17 to the contact pads 15 and curing of the epoxy underfill occur simultaneously in a manner which reduces the time required for these processes, while providing an electronic subassembly having a reliable connection between the integrated circuit 11 and the flexible circuit 13.

As shown in block 207, following the act of applying heat 205, the flexible circuit assembly is removed from the alignment fixture.

As shown in block 208, encapsulant 22 is optionally applied to a substantial portion of the integrated circuit 11 and the flexible substrate 13 proximate the integrated circuit 11, if desired.

Thus, according to the present invention, a reliable method for attaching an integrated circuit or the like to flexible circuitry is provided. Problems due to the undesirable formation of stress cracks within the contact bumps of the flexible circuitry are mitigated and an epoxy underfill is optionally utilized without requiring the undesirable separate application of heat to effect epoxy underfill curing.

It is understood that the exemplary method for attaching an integrated circuit to a flexible circuit described herein and shown in the drawings represents only a presently preferred embodiment of the invention. Indeed, various modifications and additions may be made to such embodiment without departing from the spirit and scope of the invention. For example, various different electronic devices, other than integrated circuits, may be attached to flexible circuitry according to the present invention. Thus, this and other modifications and additions may be obvious to those skilled in the art and may be implemented to adapt the present invention for use in a variety of different applications.

What is claimed is:

1. A method for forming a contact bump, the method comprising:

forming a conductive material to have a height of between approximately 0.001 inch and approximately 0.008 inch;

forming the conductive material to have a base width of between approximately 0.001 inch and approximately 0.010 inch;

forming the conductive material to have a slope angle of between approximately 40 degrees and approximately 80 degrees;

forming the conductive material to have a tip radius of between approximately 0.001 inch and approximately 0.030 inch; and wherein the height, width, slope angle, and tip radius interact to produce the bump having a shape which mitigates local stress buildup.

2. The method as recited in claim 1, wherein:

the conductive material is formed to have a height of approximately 0.006 inch;

the conductive material is formed to have a base width of approximately 0.008 inch;

the conductive material is formed to have a slope angle of approximately 75 degrees; and the conductive material is formed to have a tip radius of approximately 0.020 inch.

3. A method for attaching an integrated circuit to a flexible circuit while mitigating local stress buildup, the method comprising:

providing an integrated circuit having a plurality of contact pads formed upon a surface thereof;

providing a flexible circuit having a plurality of contact bumps formed integral to a surface thereof;

attaching the integrated circuit to the flexible circuit by fusing at least some of the contact bumps of the flexible circuit to at least some of the contact pads of the integrated circuit; and wherein the contact bumps have a shape which mitigates local stress buildup within the contact bumps after attachment of the contact bumps to the contact pads, said shape which mitigates local stress buildup having a low aspect ratio defined by a height, base width, slope angle, and tip radius of each contact bump.

4. The method as recited in claim 3, wherein the contact pads of the integrated circuit comprise aluminum contact pads.

5. The method as recited in claim 3, wherein the contact bumps of the flexible circuit have a shape which facilitates distribution of stress throughout the contact bumps after attachment of the contact bumps to the contact pads.

6. The method as recited in claim 3, wherein the contact bumps of the flexible circuit have a shape which facilitates distribution of stress generally equally throughout the contact bumps after attachment of the contact bumps to the contact pads.

7. The method as recited in claim 3, wherein the contact bumps of the flexible circuit have a shape which enhances penetration of an oxidation layer of the contact pads of the integrated circuit by the contact bumps.

8. The method as recited in claim 3, wherein the contact bumps of the flexible circuit have a height of between approximately 0.001 inch and approximately 0.008 inch, a base width of between approximately 0.001 inch and approximately 0.010 inch, a slope angle of between approximately 40 degrees and approximately 80 degrees and a tip radius of between approximately 0.001 inch and approximately 0.030 inch.

9. The method as recited in claim 3, wherein the contact bumps of the flexible circuit have a height of approximately 0.006 inch, a base width of approximately 0.008 inch, a slope angle of approximately 75 degrees and a tip radius of approximately 0.020 inch.

10. The method as recited in claim 3, wherein the contact pads of the integrated circuit are non-lead containing contact pads.

11. The method as recited in claim 3, wherein the contact bumps of the flexible circuit are formed such that the number of contact bumps generally corresponds to the number of contact pads of the integrated circuit and such that the contact bumps of the flexible circuit are configured in a generally complimentary fashion with respect to the contact pads of the integrated circuit.

12. The method for attaching an integrated circuit to a flexible circuit as recited in claim 3, wherein the contact pads of the integrated circuit comprise generally flat pads.

13. The method for attaching an integrated circuit to a flexible circuit as recited in claim 3, wherein the contact pads of the integrated circuit comprise generally flat aluminum pads.

14. The method for attaching an integrated circuit to a flexible circuit as recited in claim 3, wherein the contact bumps of the flexible circuit comprise substantially pure gold.

15. The method for attaching an integrated circuit to a flexible circuit as recited in claim 3, wherein the contact bumps of the flexible circuit comprise a layer of substantially pure gold.

16. The method for attaching an integrated circuit to a flexible circuit as recited in claim 3, wherein the contact bumps of the flexible circuit comprise a layer of substantially pure gold formed upon a layer of copper.

17. The method for attaching an integrated circuit to a flexible circuit as recited in claim 3, wherein fusing the contact bumps of the flexible circuit to the contact pads of the integrated circuit comprises applying thermocompression to the contact bumps of the flexible circuit and the contact pads of the integrated circuit.

18. The method for attaching an integrated circuit to a flexible circuit as recited in claim 3, wherein fusing the contact bumps of the flexible circuit to the contact pads of the integrated circuit comprises applying thermosonic energy to the contact bumps of the flexible circuit and the contact pads of the integrated circuit.

19. The method for attaching an integrated circuit to a flexible circuit as recited in claim 3, further comprising applying an epoxy underfill intermediate the flexible circuit and the integrated circuit prior to attaching the integrated circuit to the flexible circuit.

20. The method for attaching an integrated circuit to a flexible circuit as recited in claim 3, further comprising applying an epoxy underfill to the flexible circuit prior to attaching the integrated circuit to the flexible circuit.

21. The method for attaching an integrated circuit to a flexible circuit as recited in claim 3, further comprising applying an epoxy underfill to the integrated circuit prior to attaching the integrated circuit to the flexible circuit.

22. The method for attaching an integrated circuit to a flexible circuit as recited in claim 3, further comprising applying an epoxy underfill intermediate the flexible circuit and the integrated circuit prior to attaching the integrated circuit to the flexible circuit and wherein heat is applied to facilitate generally simultaneous curing of the epoxy underfill and fusion of the contact bumps of the flexible circuit with the contact pads of the integrated circuit.

23. The method for attaching an integrated circuit to a flexible circuit as recited in claim 3, further comprising applying an encapsulant such that the encapsulant substantially covers the integrated circuit and also covers a portion of the flexible circuit proximate the integrated circuit.

24. The method for attaching an integrated circuit to a flexible circuit as recited in claim 3, further comprising applying Hysol FP4544 such that the Hysol FP4544 substantially covers the integrated circuit and also covers a portion of the flexible circuit proximate the integrated circuit.

25. A method for attaching an integrated circuit to a flexible circuit, the method comprising:

providing an integrated circuit having a plurality of contact pads formed upon a surface thereof;

providing a flexible circuit having a plurality of contact bumps formed upon a surface thereof;

applying an epoxy underfill intermediate the flexible circuit and the integrated circuit; and attaching the integrated circuit to the flexible circuit by fusing at least some of the contact bumps of the flexible circuit to corresponding contact pads of the integrated circuit after the epoxy underfill has been applied.

26. The method as recited in claim 25, wherein the contact pads of the integrated circuit comprise contact pads.

27. The method for attaching an integrated circuit to a flexible circuit as recited in claim 25, wherein applying an epoxy underfill intermediate the flexible circuit and the integrated circuit comprises applying an epoxy underfill to the flexible circuit prior to attaching the integrated circuit thereto.

28. The method for attaching an integrated circuit to a flexible circuit as recited in claim 25, wherein applying an epoxy underfill intermediate the flexible circuit and the integrated circuit comprises applying an epoxy underfill to the integrated circuit prior to attaching the integrated circuit to the flexible circuit.

29. The method for attaching an integrated circuit to a flexible circuit as recited in claim 25, wherein heat is applied to facilitate generally simultaneous curing of the epoxy underfill and fusion of the contact bumps of the flexible circuit with the contact pads of the integrated circuit.

30. The method as recited in claim 25, wherein the contact bumps of the flexible circuit are formed such that the number of contact bumps generally corresponds to the number of contact pads of the integrated circuit and wherein the contact bumps of the flexible circuit are configured in a generally complimentary fashion with respect to the contact pads of the integrated circuit.

31. The method for attaching an integrated circuit to a flexible circuit as recited in claim 25, wherein the contact pads of the integrated circuit comprise generally flat pads.

32. The method for attaching an integrated circuit to a flexible circuit as recited in claim 25, wherein the contact pads of the integrated circuit comprise generally flat aluminum pads.

33. The method for attaching an integrated circuit to a flexible circuit as recited in claim 25, wherein the contact bumps of the flexible circuit comprise substantially pure gold.

34. The method for attaching an integrated circuit to a flexible circuit as recited in claim 25, wherein the contact bumps of the flexible circuit comprises a layer of substantially pure gold.

35. The method for attaching an integrated circuit to a flexible circuit as recited in claim 25, wherein the contact bumps of the flexible circuit comprise a layer of substantially pure gold formed upon a layer of copper.

36. The method for attaching an integrated circuit to a flexible circuit as recited in claim 25, wherein fusing the contact bumps of the flexible circuit to the contact pads of the integrated circuit comprises applying thermocompression to the contact bumps of the flexible circuit and the contact pads of the integrated circuit.

37. The method for attaching an integrated circuit to a flexible circuit as recited in claim 25, wherein fusing the contact bumps of the flexible circuit to the contact pads of the integrated circuit comprises applying thermosonic energy to the contact bumps of the flexible circuit and the contact pads of the integrated circuit.

38. The method for attaching an integrated circuit to a flexible circuit as recited in claim 25, further comprising applying an encapsulant such that the encapsulant substantially covers the integrated circuit and also covers a portion of the flexible circuit proximate the integrated circuit.

39. The method for attaching an integrated circuit to a flexible circuit as recited in claim 25, further comprising applying Hysol FP4544 such that the Hysol FP4544 substantially covers the integrated circuit and also covers a portion of the flexible circuit proximate the integrated circuit.

40. A method for attaching a first electrical component to a second electrical component, the method comprising:

forming contact pads upon the first electrical component; and forming corresponding contact bumps upon the second electrical component, the contact bumps having a shape which mitigates local stress buildup within the contact bumps after attachment of the contact bumps to the contact pads and the contact bumps also having a shape which enhances penetration of an oxide layer of the contact pads of the first electrical circuit.

* * * * *

UNITED STATES PATENT AND TRADEMARK OFFICE
CERTIFICATE OF CORRECTION

PATENT NO. : 6,434,817 B1
DATED : August 20, 2002
INVENTOR(S) : Feigenbaum et al.

It is certified that error appears in the above-identified patent and that said Letters Patent is hereby corrected as shown below:

<u>Title page,</u>
Item [75], Inventors, should read:
-- Haim Feigenbaum, Irvine, CA
Chris M. Schreiber, Lake Elsinore, CA
Zhiping Wang, Singapore
Tan Yeow Meng, Singapore
Christina Chung Man Tsui, Singapore --

Signed and Sealed this

Fourth Day of March, 2003

JAMES E. ROGAN
*Director of the United States Patent and Trademark Office*